United States Patent
Park et al.

(10) Patent No.: US 11,402,706 B2
(45) Date of Patent: Aug. 2, 2022

(54) DISPLAY DEVICE AND METHOD OF MANUFACTURING THE SAME

(71) Applicant: Samsung Display Co., Ltd., Yongin-Si (KR)

(72) Inventors: Dong Jin Park, Hwaseong-si (KR); Byeong Soo Kang, Hwaseong-si (KR); Nag Joon Kim, Asan-si (KR); Sung Hyun Kim, Hwaseong-si (KR); Chung Hyuk Shin, Asan-si (KR)

(73) Assignee: Samsung Display Co., Ltd.

( * ) Notice: Subject to any disclaimer, the term of this patent is extended or adjusted under 35 U.S.C. 154(b) by 84 days.

(21) Appl. No.: 16/717,749

(22) Filed: Dec. 17, 2019

(65) Prior Publication Data
US 2020/0264468 A1  Aug. 20, 2020

(30) Foreign Application Priority Data

Feb. 19, 2019 (KR) .................. 10-2019-0019063

(51) Int. Cl.
| | | |
|---|---|---|
| G02F 1/1345 | (2006.01) | |
| H05K 1/18 | (2006.01) | |
| H05K 3/32 | (2006.01) | |
| G02F 1/1368 | (2006.01) | |
| H01L 27/32 | (2006.01) | |

(52) U.S. Cl.
CPC ...... G02F 1/13458 (2013.01); G02F 1/13452 (2013.01); *G02F 1/1368* (2013.01); *H01L 27/3276* (2013.01); *H05K 1/189* (2013.01); *H05K 3/32* (2013.01); *H05K 2201/10128* (2013.01); *H05K 2201/10136* (2013.01)

(58) Field of Classification Search
CPC ............. G02F 1/13458; G02F 1/13452; G02F 1/13454; G02F 1/13456
See application file for complete search history.

(56) References Cited

U.S. PATENT DOCUMENTS

| | | | |
|---|---|---|---|
| 9,958,718 | B2 | 5/2018 | Shin et al. |
| 2017/0357121 | A1* | 12/2017 | Cho .................. G02F 1/136286 |
| 2018/0130779 | A1 | 5/2018 | Pokhriyal et al. |
| 2018/0173032 | A1* | 6/2018 | Suga ................. G02F 1/133512 |

FOREIGN PATENT DOCUMENTS

| | | |
|---|---|---|
| KR | 10-1999-0076291 A | 10/1999 |
| KR | 10-2017-0080937 A | 7/2017 |
| KR | 10-2017-0139211 A | 12/2017 |

* cited by examiner

*Primary Examiner* — Dung T Nguyen
(74) *Attorney, Agent, or Firm* — Innovation Counsel LLP

(57) ABSTRACT

A display device includes: a display panel including a first substrate including a thin film transistor, a second substrate facing the first substrate and a wiring layer disposed on the first substrate; and a flexible circuit board disposed on a first lateral side of the display panel, wherein the first lateral side of the display panel includes a recess portion, the wiring layer is exposed in the recess portion on the first lateral side, the flexible circuit board includes a conductive pad, and the conductive pad contacts the wiring layer in the recess portion to electrically connect the flexible circuit board and the wiring layer. The recess portion includes a first recess disposed on the first substrate.

14 Claims, 13 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2019-0019063 filed in the Korean Intellectual Property Office on Feb. 19, 2019, the entire contents of which are incorporated herein by reference.

BACKGROUND

(a) Technical Field

The present inventive concept relates to a display device, and it particularly relates to a display device including a conductive pad on a lateral side of a display device and a manufacturing method thereof.

(b) Description of the Related Art

Various display devices such as a liquid crystal display (LCD) or an organic light emitting diode display (OLED) include a display panel on which a plurality of pixels for displaying images is formed, and a driving circuit for driving the display panel.

The display panel includes a display area in which a plurality of pixels are formed. A bezel region that is a peripheral area that displays no images may be provided near the display area. Various kinds of driving circuits and wires may be provided in the bezel region.

Recently, to reduce the bezel region that is a non-display area, research and development on techniques for bonding an integrated circuit (IC), other types of printed circuits, and wires to a lateral side of the display panel have been in active progress.

The above information disclosed in this Background section is only for enhancement of understanding of the background of the inventive concept and therefore it may contain information that does not form the prior art that is already known in this country to a person of ordinary skill in the art.

SUMMARY

The present inventive concept has been made in an effort to provide a display device for preventing a short circuit of wires and improving defects by forming a recess portion on a lateral side of a display panel and increasing a contact area between a wire exposed on the lateral side of the display panel and a conductive pad, and improving efficiency by reducing contact resistance, and a manufacturing method thereof.

An exemplary embodiment of the present inventive concept provides a display panel including a first substrate including a thin film transistor, a second substrate facing the first substrate and a wiring layer disposed on the first substrate; and a flexible circuit board disposed on a first lateral side of the display panel, wherein the first lateral side of the display panel includes a recess portion, the wiring layer is exposed in the recess portion on the first lateral side, the flexible circuit board includes a conductive pad, and the conductive pad contacts the wiring layer in the recess portion to electrically connect the flexible circuit board and the wiring layer, wherein the recess portion includes a first recess disposed on the first substrate.

The recess portion may further include a second recess portion disposed on the second substrate and a third recess portion disposed on the wiring layer.

The first recess portion, the second recess portion and the third recess portion may be recessed from the first lateral side by a first depth, and the first depth is 0.5 μm to 10 μm.

The display device may further include a conductive filler disposed between the conductive pad and the wiring layer to fill the recess portion.

The recess portion may include a plurality of recess portions, at least two recess portions among the plurality of recess portions having different widths.

The wiring layer may include a first wiring layer and a second wiring layer electrically connected to each other, the first wiring layer may include a same material as and is formed at the same time with a gate electrode of the thin film transistor, and the second wiring layer may include a same material as and is formed at the same time with a data line of the thin film transistor.

A height of the recess portion may be greater than a thickness of the wiring layer, and the conductive pad may completely fill the recess portion.

The display device may further include a dummy pattern disposed on the wiring layer to overlap the wiring layer, the dummy pattern directly contacting the conductive pad, and a column spacer disposed on the dummy pattern to overlap the dummy pattern, the column spacer directly contacting the conductive pad.

Another embodiment of the present inventive concept provides a display device including: a display panel including a first substrate including a thin film transistor, a second substrate facing the first substrate and a wiring layer disposed on the first substrate; and a flexible circuit board disposed on a first lateral side of the display panel, wherein the first lateral side of the display panel includes a recess portion, the wiring layer is exposed in the recess portion on the first lateral side, the flexible circuit board includes a conductive pad, and the conductive pad contacts the wiring layer in the recess portion to electrically connect the flexible circuit board and the wiring layer, wherein a height of the recess portion is equivalent to a thickness of the wiring layer.

The display device may further include a dummy pattern disposed on the wiring layer to overlap the wiring layer, the dummy pattern directly contacting the conductive pad, and a column spacer disposed on the dummy pattern to overlap the dummy pattern, the column spacer directly contacting the conductive pad.

The recess portion may be recessed from the first lateral side by a first depth, and wherein the first depth is 0.5 μm to 10 μm.

The display device may further include a conductive filler disposed between the conductive pad and the wiring layer to fill the recess portion.

The recess portion may include a plurality of recess portions, at least two recess portions among the plurality of recess portions having different widths.

The wiring layer may include a first wiring layer and a second wiring layer electrically connected to each other, the first wiring layer includes a same material as and is formed at the same time with a gate electrode of the thin film transistor, and the second wiring layer includes a same material as and is formed at the same time with a data line of the thin film transistor.

The conductive pad may completely fill the recess portion.

Another embodiment of the present inventive concept provides a method for manufacturing a display device, including: washing a first lateral side of a display panel in which a first display panel and a second display panel facing the first display panel are bonded; heating the first lateral side of the display panel with a first laser; coating a conductive paste on the first lateral side of the display panel after the heating the first lateral side of the display panel with the laser; hardening the conductive paste with a second laser; and; and forming a conductive pad by patterning the conductive paste with laser beams after hardening the conductive paste, wherein the first display panel includes a wiring layer, and the wiring layer is exposed on the first lateral side of the display panel.

In the heating of the first lateral side of the display panel with the first laser, the laser may generate pulse-type first laser beams having first energy, and the first laser beams may be repeatedly applied to the first lateral side of the display panel.

During the first lateral side of the display panel is heated with the first laser beams, an organic residue on the first lateral side of the display panel may be removed, and a recess portion may be formed.

The laser beams for forming the conductive pad may have a second energy greater than the first energy.

The method may further include, after the forming of a conductive pad, attaching a flexible circuit board including a data driver to the conductive pad.

According to the exemplary embodiments, the short circuit of wires is prevented and defects are reduced by forming a recess portion on a lateral side of a display panel and increasing a contact area between a wire exposed on the lateral side of the display panel and a conductive pad, and efficiency is improved by reducing contact resistance.

DETAILED DESCRIPTION OF THE EMBODIMENTS

Figure 1:
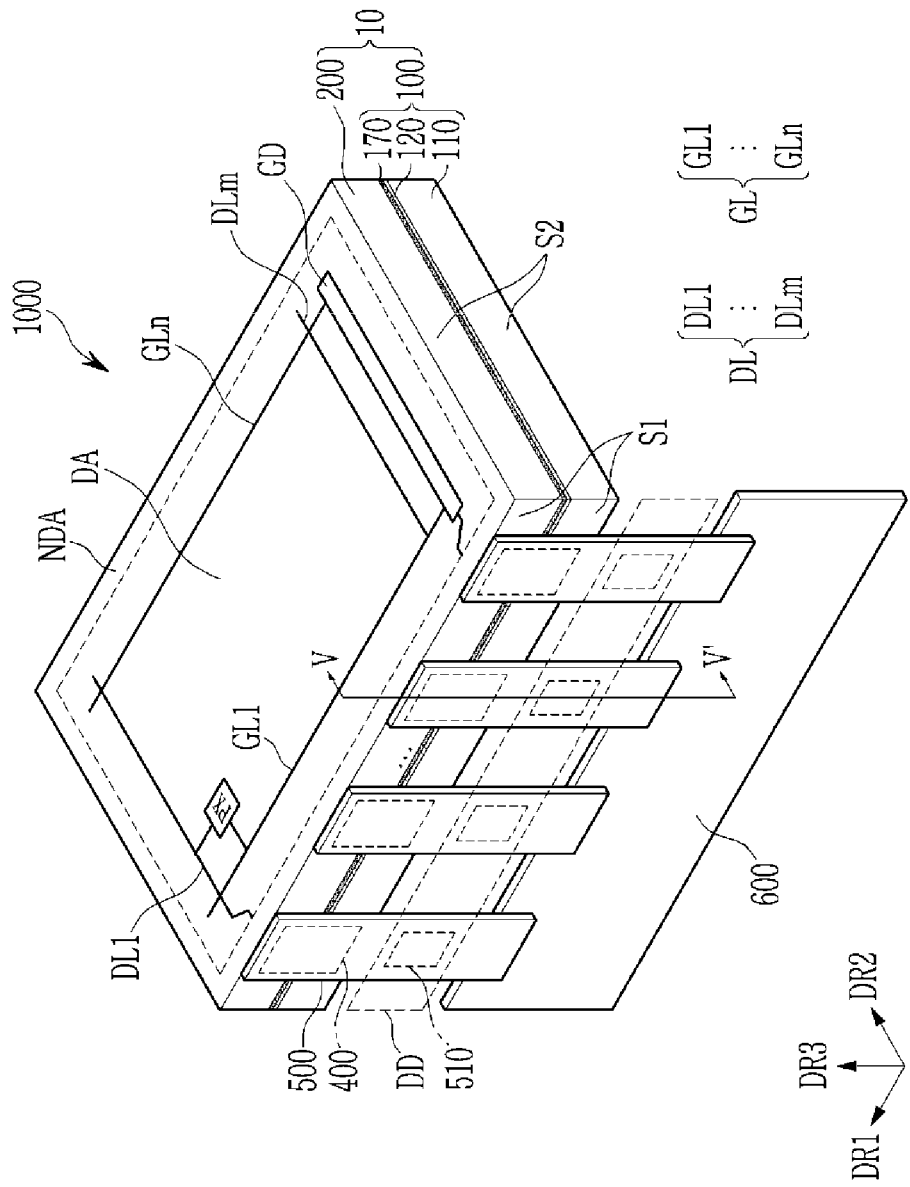
FIG. 1 shows a perspective view of a display device according to an exemplary embodiment.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

The drawings and description are to be regarded as illustrative in nature and not restrictive, and like reference numerals designate like elements throughout the specification.

The size and thickness of each configuration shown in the drawings are arbitrarily shown for better understanding and ease of description, and the present inventive concept is not limited thereto. The thicknesses of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

A display device according to an exemplary embodiment will now be described with reference to FIG. 1. FIG. 1 shows a perspective view of a display device according to an exemplary embodiment.

Referring to FIG. 1, the display device 1000 according to an exemplary embodiment includes a display panel 10, a flexible circuit board 500 attached to a first lateral side of the display panel 10, and a driving circuit substrate 600.

The display panel 10 includes a first display panel 100 and a second display panel 200 bonded to each other, and although not shown, it may further include a backlight unit on a bottom of the first display panel 100 of the display panel 10.

The display device 1000 may be a liquid crystal display (LCD) in which a liquid crystal layer (300, refer to FIG. 5) is provided between the first display panel 100 and the second display panel 200. The display device 1000 may be an organic light emitting diode display (OLED) in which, rather than the liquid crystal layer (300, refer to FIG. 5), an organic light emitting element is disposed between the first display panel 100 and the second display panel 200. In this instance, at least one of the first display panel 100 and the second display panel 200 may include a touch electrode for sensing a touch provided from the outside. According to exemplary embodiments, the display device 1000 may further include a color converting layer disposed between the first display panel 100 and the second display panel 200. The color converting layer may include quantum dots and/or color filters (CF, refer to FIGS. 5-8) disposed in the liquid crystal display (LCD) and the organic light emitting device (OLED). The liquid crystal display (LCD) may further include a backlight unit for emitting blue light. The organic light emitting element in the organic light emitting device (OLED) may emit blue light. The display device 1000 is not limited to the above-described example.

In the display panel 10, the first display panel 100 may be a thin film transistor (TFT) substrate including a transistor (TR, refer to FIGS. 5-8) to be described, and the second display panel 200 may be a color converting substrate which includes the color converting layers, for example, color filters (CF) and/or quantum dots. However, depending on exemplary embodiments, the transistor (TR) and the color converting layer may be provided on a same substrate, which is referred to as a color filter on array (COA) structure, and positions of the transistor (TR) and the color filter (CF) are not limited disclosed in the exemplary embodiment.

The first display panel 100 and the second display panel 200 of the display panel 10 may respectively have a rectangular shape having a long side extending in a first direction DR1 and a short side extending in a second direction DR2 traversing the first direction DR1. According to exemplary embodiments, a predetermined region of the first display panel 100 and the second display panel 200 may have a curve. The display panel 10 may include a first lateral side S1 provided along the long side and a second lateral side S2 provided along the short side. The display panel 10 may include a first lateral side S1, a second lateral side S2, a third lateral side (not shown) facing the first lateral side S1 and a fourth lateral side (not shown) facing the second lateral side S2.

The first display panel 100 includes a first substrate 110 and a plurality of thin-film layers disposed thereon. A wiring layer 180 is provided on the first substrate 110, and the wiring layer 180 includes a first wiring layer 120 and a second wiring layer 170. For ease of description, the first wiring layer 120 and the second wiring layer 170 are respectively shown to be a single layer, and the first wiring layer 120 and the second wiring layer 170 may be etched and disposed with appropriate patterns for configuring various signal lines, transistors (TR), and light-emitting devices. Hereinafter, different parts of the wiring layer 180 disposed on each of a corresponding conductive pad 400 may not be electrically connected to each other.

For example, the first wiring layer 120 and the second wiring layer 170 may include constituent elements of the transistor (TR) and portions that contact the conductive pad 400. The first wiring layer 120 may include the same material as and be formed at the same time with a gate electrode and a gate line (GL) for transmitting a gate signal to a pixel PX. The second wiring layer 170 may include the same material as and be formed at the same time with a data line (DL) for transmitting a data signal to the pixel PX. In the exemplary embodiment, the wiring layer 180 includes a first wiring layer 120 and the second wiring layer 170, however, the wiring layer 180 may be a single conductive layer or a wiring layer having more than three wiring layers.

The flexible circuit board 500 is attached to the first lateral side of the display panel 10. The flexible circuit board 500 includes a conductive pad 400. The flexible circuit board 500 may be connected to signal lines on the display panel 10 through the conductive pad 400. The signal lines on the display panel 10 may correspond to the wiring layer 180. The driving circuit substrate 600 may be bent at the bottom side of the first display panel 100 so that the driving circuit substrate 600 may be disposed on the bottom side of the first substrate 100.

The flexible circuit board 500 in FIG. 1 is disposed on the first lateral side S1, but it may be disposed on the second lateral side S2, and it may be disposed on both the first lateral side S1 and the second lateral side S2. According to exemplary embodiment, the flexible circuit board 500 may be respectively provided on the first lateral side S1 and the third lateral side (not shown) facing the first lateral side S1, and may be respectively provided on the second lateral side S2 and the fourth lateral side (not shown) facing the second lateral side S2. A position for the flexible circuit board 500 to be connected to the display panel 10 through the conductive pad 400 is not limited thereto.

The flexible circuit board 500 is attached to the first lateral side S1 of the display panel 10, and the conductive pad 400 is provided between the flexible circuit board 500 and the first lateral side S1 of the display panel 10 as shown as dotted lines in FIG. 1. A detailed structure in which the conductive pad 400 is attached to the first lateral side of the display panel 10 will be further described with reference to FIG. 3.

The conductive pad 400 may be electrically connected to the flexible circuit board 500 through a conductive adhesive film (440, refer to FIG. 5) provided on the corresponding conductive pad 400. The conductive adhesive film 440 may be omitted and the conductive pad 400 may be directly formed on the flexible circuit board 500. A data driver (DD) including at least one driving chip 510 may be provided on the flexible circuit board 500 as described above.

A driving circuit substrate 600 may be electrically connected to one end of the flexible circuit board 500. In detail, respective access wires (not shown) may be electrically connected to each other through pads on each of the flexible circuit board 500 and the driving circuit substrate 600. Accordingly, electrical signals such as gate signals, data signals, and image data output by the driving circuit substrate 600 are transmitted to the flexible circuit board 500, and may then be transmitted to the wiring layer 180 of the display panel 10 through the conductive pad 400.

Regarding the display device 1000 according to an exemplary embodiment, a recess portion (R, refer to FIG. 2 and FIG. 4) is provided on the first lateral side (the first lateral side S1 in FIG. 1) of the display panel 10 so that the contact area between the wiring layer 180 on the display panel 10 and the conductive pad 400 on the flexible circuit board 500 attached to the first lateral side increases and contact resistance reduces. Accordingly, adhesion of the flexible circuit board 500 to the wiring layer 180 of the display panel 10 may be reinforced and open circuit of the wiring layer adjacent to each other may be prevented so that defects of the display device 1000 may be resultantly prevented. This will be described in detail with reference to FIG. 2.

Main surfaces of the first display panel 100 and the second display panel 200 are disposed in parallel with each other. The main surfaces of the first display panel 100 and the second display panel 200 are shown to extend to a plane that is parallel to a plane formed by the first direction DR1 and the second direction DR2.

The first display panel 100 and the second display panel 200 may include glass having a rigid characteristic, or may include a flexible substrate. When the first display panel 100 and the second display panel 200 are flexible, they may include metal thin films or very thin glass, or various types of plastic such as polyethylene terephthalate (PET), polyethylene naphthalate (PEN), polycarbonate (PC), polyarylate (PAR), polyether imide (PEI), polyether sulfone (PES), or polyimide (PI).

The display panel 10 includes a display area (DA) for displaying images and a peripheral area (NDA) provided around the display area (DA) and not displaying images. The peripheral area (NDA) may be provided to surround the display area (DA).

A plurality of pixels PX and a plurality of signal lines are provided in the display area (DA). The pixel PX represents a unit for emitting a predetermined color of light and includes at least one pixel electrode. The pixel may emit light with luminance corresponding to a gray of an input image signal. In the present disclosure, the pixel PX may include a transistor (TR) and a light-emitting device configured to emit light. A plurality of pixels PX may be arranged in a matrix form, and it is not limited thereto.

A plurality of signal lines include m data lines (DL; DL1, ..., DLm) and n gate lines (GL; GL1, ..., GLn). The data lines (DL) and the gate lines (GL) may be disposed to be insulated from each other and traverse each other. The gate line (GL) may extend in the first direction DR1 and may be electrically connected to the gate driver (GD). The data line (DL) may extend in the second direction DR2 and may be electrically connected to the data driver (DD). In further detail, the data line (DL) may extend in the second direction DR2 on the display panel 10, may be bent along one lateral side of the display panel 10 and extend in the third direction DR3 along the one lateral side of the display panel 10, and may be electrically connected to the data driver (DD).

The gate driver (GD), although shown as if it is provided on a top side of the second display panel 200 in FIG. 1, may be provided on a top side of the first display panel 100 facing the second display panel 200. The gate driver (GD) may be provided along at least one short side of the first display panel 100. However, the position of the gate driver (GD) is not limited thereto.

The gate driver (GD) may include a plurality of driving chips each mounted on a flexible printed circuit board, a tape carrier package (TCP), and connected to the first display panel 100. According to an exemplary embodiment, the gate driver (GD) may be directly formed on the first substrate 110 simultaneously with transistors (TR) for driving the pixels PX, and may include an amorphous silicon TFT gate driver circuit (ASG) or an oxide silicon TFT gate driver circuit (OSG).

The data driver (DD) may include at least one driving chip 510. FIG. 1 shows four driving chips 510 for convenience of description, the number of driving chips 510 is not limited thereto.

The driving circuit substrate 600 may include a timing controller (not shown). The timing controller may be an integrated circuit (IC) mounted on the driving circuit substrate 600 and may be electrically connected to the gate driver (GD) and the data driver (DD). The timing controller (not shown) may output a gate control signal, a data control signal, and image data. According to exemplary embodiments, the timing controller (not shown) and the data driver (DD) may be embedded in one chip and the one chip may be disposed on the flexible circuit board 500.

The gate driver (GD) may receive a gate control signal from the timing controller. The gate driver (GD) may generate a gate signal in response to the gate control signal and may sequentially output gate signals to the plurality of gate lines (GL). The gate signal may be provided to the pixels PX through the gate lines sequentially disposed along the first direction DR1. As a result, the pixels PX may be driven row by row.

The data driver (DD) may receive image data and data control signals from the timing controller. The data driver (DD) may generate an analog data voltage corresponding to the image data in response to the data control signal and may output the same to the plurality of data lines (DL). The data voltage may be provided to the pixels PX through the plurality of data lines (DL).

The pixel PX may receive the data voltage through the data line (DL) in response to the gate signal received through the gate line (GL). The pixel PX displays the gray corresponding to the data voltage thus control transmittance of respective regions in which the respective pixels PX are disposed.

Figure 2:
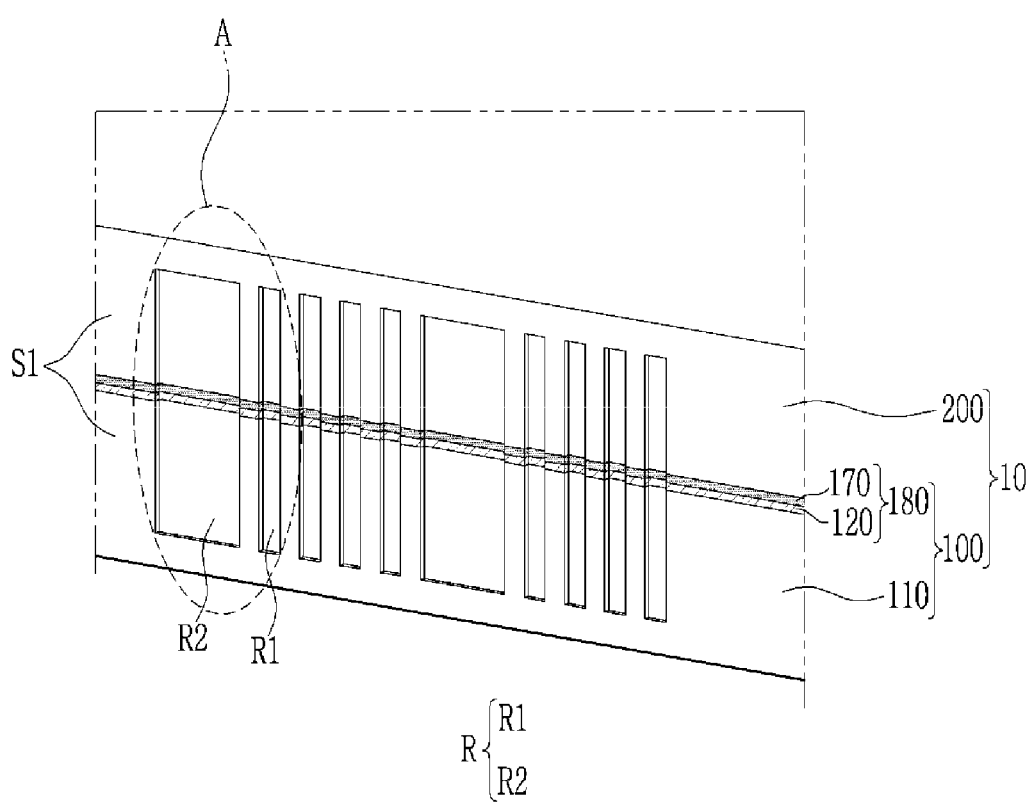
FIG. 2 and FIG. 3 show perspective views of a part of FIG. 1.
Figure 3:
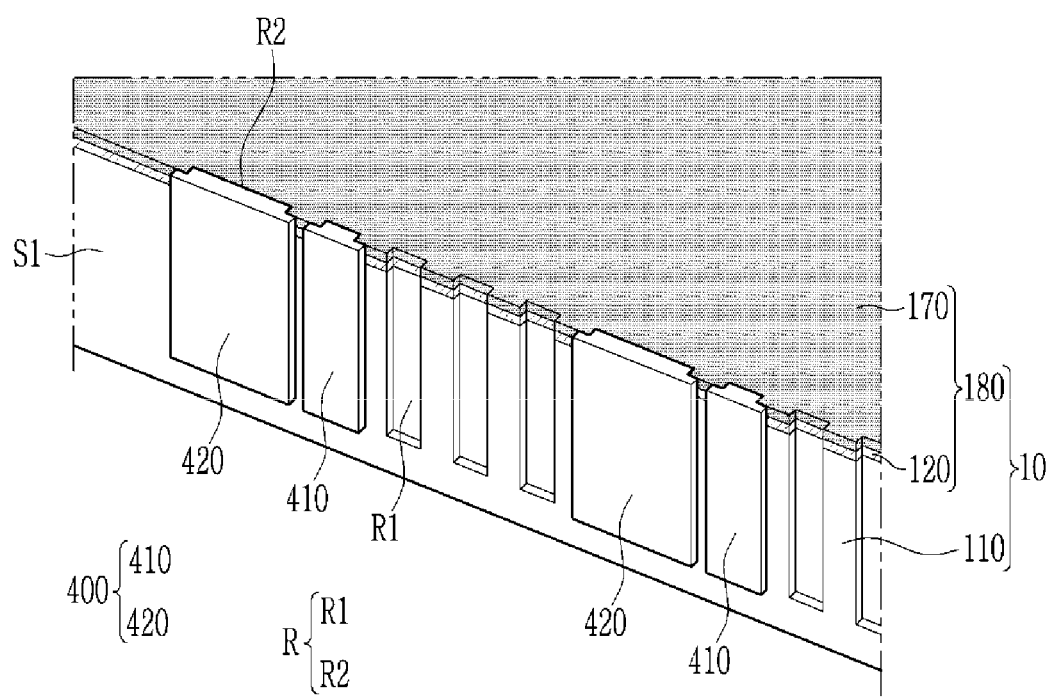

A lateral side configuration of a display device 1000 according to an exemplary embodiment will now be described with reference to FIG. 2 and FIG. 3. FIG. 2 and FIG. 3 show perspective views of a part of FIG. 1, and show the recess portion R formed on the first lateral side S1 of the display panel 10 and the conductive pad 400 in FIG. 1.

Referring to FIG. 2, the display panel 10 includes a first display panel 100 including a first substrate 110 and a wiring layer 180, and a second display panel 200 facing the first display panel 100.

The wiring layer 180 is provided on the first substrate 110. The wiring layer 180 includes a first wiring layer 120 and a second wiring layer 170 as described above. Regarding the display device according to an exemplary embodiment, the first wiring layer 120 may include a gate line (GL, refer to FIG. 1) and the second wiring layer 170 may include a data line (DL, refer to FIG. 1).

Part of the wiring layer 180 disposed between the first display panel 100 and the second display panel 200 on the first lateral side S1 of the display panel 10 is exposed to outside. As described, the flexible circuit board 500 may be attached to a first lateral side of the substrate on which the wiring layer 180 is exposed. In this instance, the flexible circuit board 500 and the driving circuit substrate 600 may be electrically connected to the wiring layer 180 of the display panel 10 through the conductive pad 400 disposed on the flexible circuit board 500.

A recess portion R is formed on the first lateral side S1 of the display panel 10. The recess portion R may include a first recess portion R1 and a second recess portion R2. The recess portion R may include a plurality of first recess portions R1 and a plurality of second recess portions R2. The recess portion R may include only the first recess portion R1. The first recess portion R1 may be a portion that corresponds to the data line (DL) as shown in FIG. 1. A horizontal width of the first recess portion R1 may be less than a horizontal width of the second recess portion R2. A portion including at least one first recess portion R1 and at least one second recess portion R2 will referred to as a portion A, and the recess portion R will be described with reference to FIG. 4.

Referring to FIG. 3, a conductive pad 400 is disposed on the recess portion R formed on the first lateral side S1 of the display panel 10. FIG. 3 shows a structure in which a first substrate 110 that is a portion of the first display panel 100 is provided, and a first wiring layer 120 and a second wiring layer 170 provided thereon are provided on the first lateral side S1. The recess portion R may include a first recess portion R1 and a second recess portion R2. FIG. 3 shows that the conductive pad 400 is disposed on part of the recess portion R so as to show arrangement of the recess portion R and the conductive pad 400. However, the conductive pad 400 may be disposed on every recessed portion R.

The conductive pad 400 includes a first pad 410 and a second pad 420. The first pad 410 is disposed on the first recess portion R1 and the second pad 420 is disposed on the second recess portion R2. The first pad 410 and the second pad 420 may be provided to correspond to shapes of the first recess portion R1 and the second recess portion R2. The first pad 410 may be provided to completely fill the first recess portion R1 and the second pad 420 may be provided to completely fill the second recess portion R2.

Figure 4:
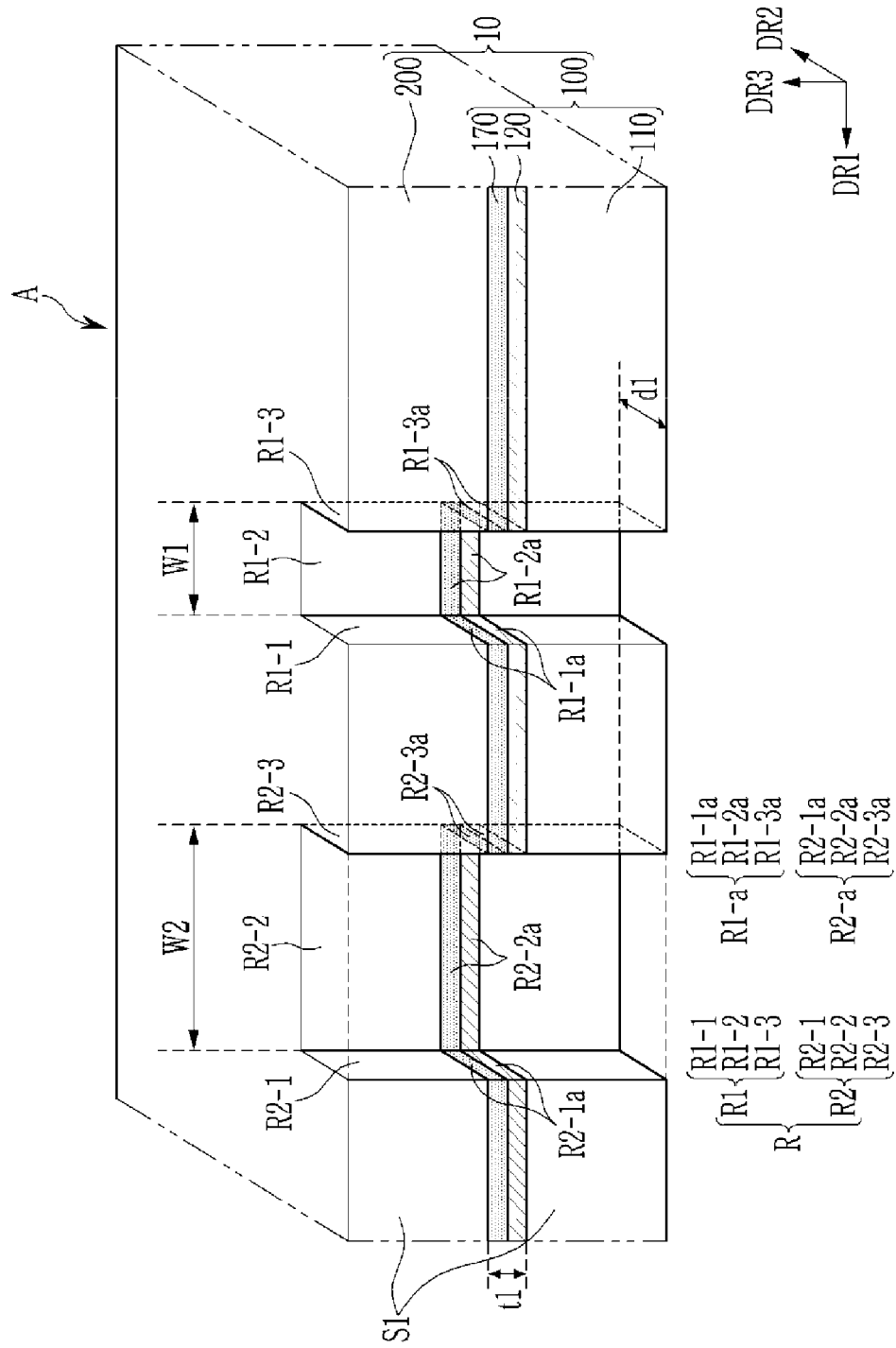
FIG. 4 shows a part of FIG. 2 in detail.

A lateral structure of a display device 1000 according to an exemplary embodiment will now be described in detail with reference to FIG. 4. FIG. 4 shows a portion A in FIG. 2 that includes one first recess portion R1 and one second recess portion R2 of FIG. 2.

Referring to FIG. 4, a recess portion R is formed on the first lateral side S1 of the display panel 10. The recess portion R includes a first recess portion R1 and a second recess portion R2. At least one first recess portion R1 and at least one second recess portion R2 may be formed on the first lateral side of the display panel 10. According to an exemplary embodiment, the recess portion R may be formed on both a first lateral side S1 and a second lateral side S2 disposed adjacent to the first lateral side S1. The recess portion R1 may be only formed on the first lateral side S1.

The first recess portion R1 includes a first portion R1-1, a second portion R1-2, and a third portion R1-3. The first portion R1-1, the second portion R1-2, and the third portion R1-3 may form a C-shaped first recess portion R1. In detail, the first portion R1-1 may extend parallel to the second lateral side S2, the second portion R1-2 may extend in parallel to the first lateral side S1 and connected to the first portion R1-1, and the third portion R1-3 may extend in parallel with the second lateral side S2 and connected to the second portion R1-2. The first portion R1-1 and the third portion R1-3 may be formed to face each other.

Figure 5:
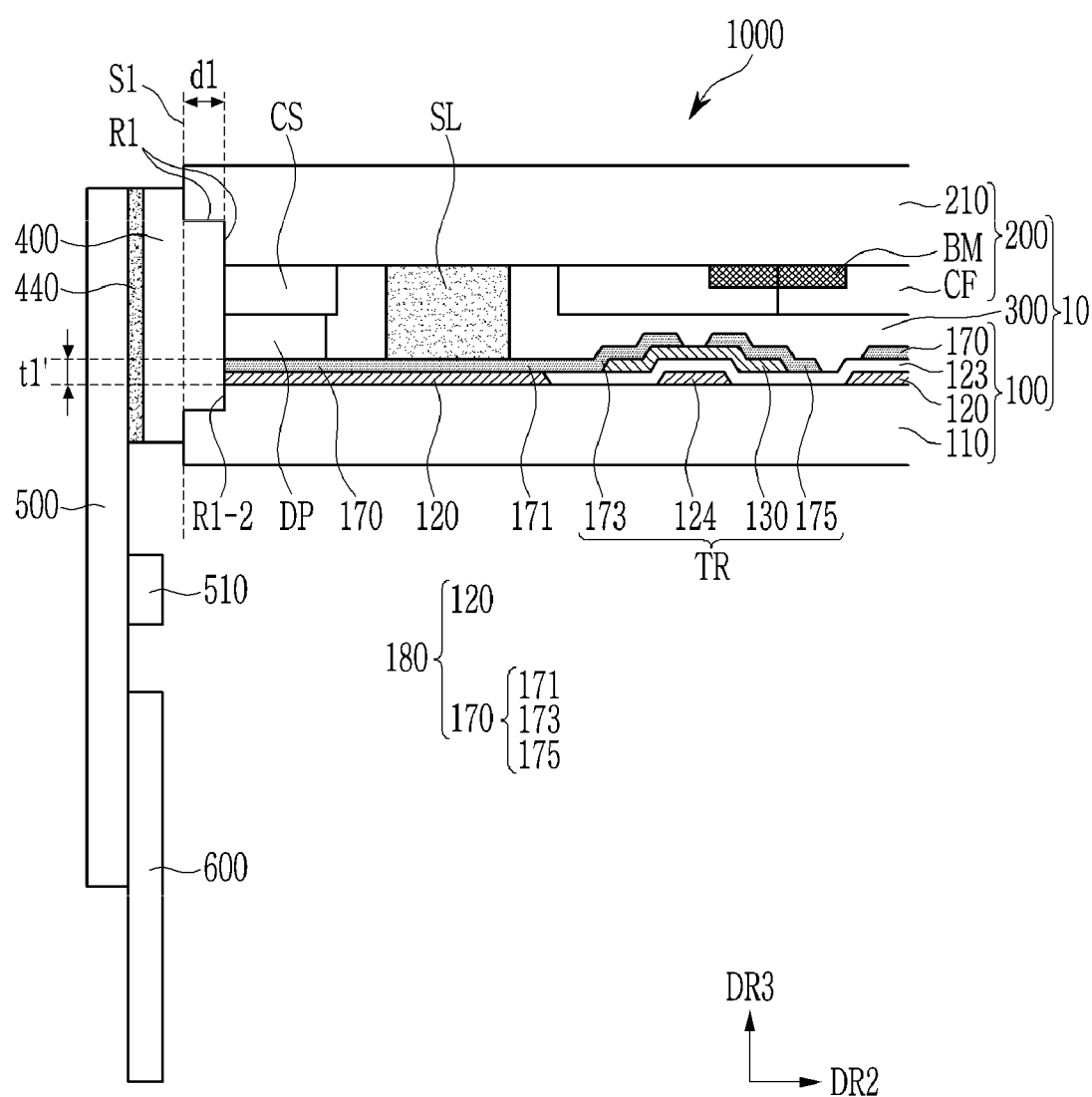
FIG. 5, FIG. 6, FIG. 7 and FIG. 8 show cross-sectional views of a display device with respect to a line V-V' of FIG. 1 according to another exemplary embodiment.

Here, a depth of the first recess portion R1 which is a minimum distance between the second portion R1-2 and the first lateral side S1 is referred to as a first depth d1 (refer to FIG. 5). The width of the first recess portion R1 is defined to be a width of the second portion R1-2 and is referred to as a first width w1 (refer to FIG. 4).

A height of the first recess portion R1 is equivalent to a height of the second portion R1-2 and it is greater than a first thickness t1 that is the thickness of the wiring layer 180. Therefore, the conductive pad 400 to be described may completely cover exposed surfaces of the first concave wire (R1-a) and part of the first display panel 100 and the second display panel 200 disposed adjacent to the first concave wire (R1-a).

The first portion R1-1, the second portion R1-2, and the third portion R1-3 of the first recess portion R1 contact the conductive pad 400.

The first portion R1-1 includes a first wire (R1-1a), the second portion R1-2 includes a second wire (R1-2a), and the third portion R1-3 includes a third wire (R1-3a). The first wire (R1-1a), the second wire (R1-2a), and the third wire (R1-3a) may form a C-shaped first concave wire (R1-a).

The second recess portion R2 includes a fourth portion R2-1, a fifth portion R2-2, and a sixth portion R2-3. The fourth portion R2-1, the fifth portion R2-2, and the sixth portion R2-3 may form a C-shaped second recess portion R2.

In detail, the fourth portion R2-1 may extend parallel to the second lateral side S2, the fifth portion R2-2 may extend in parallel to the first lateral side S1 and connected to the fourth portion R2-1, and the sixth portion R2-3 may extend in parallel to the second lateral side S2 and connected to the fifth portion R2-2. The fourth portion R2-1 and the sixth portion R2-3 may be formed to face each other.

Here, a depth of the second recess portion R2 which is a minimum distance between the fifth portion R2-2 and the first lateral side S1 is referred to as a second depth. The width of the second recess portion R2 is defined to be a width of the fifth portion R2-2, and is referred to as a second width w2.

The fourth portion R2-1, the fifth portion R2-2, and the sixth portion R2-3 of the second recess portion R2 contact the conductive pad 400.

The fourth portion R2-1 includes a fourth wire (R2-1a), the fifth portion R2-2 includes a fifth wire (R2-2a), and the sixth portion R2-3 includes a sixth wire (R2-3a) exposed to outside. The fourth wire (R2-1a), the fifth wire (R2-2a), and the sixth wire (R2-3a) extend to form a C-shaped second concave wire (R2-a).

The shape of the recess portion R is not limited to the above-noted C-shape. According to exemplary embodiments, it may have a U-shape, a reversed trapezoidal shape in which a bottom side is wider than a top side, and it may form a triangular shape which includes two portions having a predetermined angle between the first direction DR1 and the second direction DR2. The shape of the recess portion R is not limited thereto.

When the thickness of the wiring layer 180 is a first thickness t1, the first thickness t1 may be about 5 μm to 20 μm, and for example, it may be about 8.5 μm to 9.5 μm.

The first width w1 may be equal to or greater than a width of one data line. The first width w1 may be about 30 μm to about 100 μm, and for example, it may be about 70 μm to about 80 μm. The first depth d1 may be about 0.5 μm to about 10 μm, and, for example, it may be about 2.5 μm to about 3.5 μm. As described above, the first thickness t1 that is a thickness of the wiring layer 180 may be about 8.5 μm to about 9.5 μm. Here, the conductive pad 400 directly contacts the first portion R1-1 and the third portion R1-3 in addition to the second portion R1-2 of the first recess portion R1, thus a contact area between the conductive pad 400 and the wiring layer 180 in the first lateral side of the display panel 10 increases. Particularly, the conductive pad 400 contacts the first wire (R1-1a) and the third wire (R1-3a) in addition to the second wire (R1-2a) of the first concave wire (R1-a), thus the contact area of the conductive pad 400 and the wiring layer 180 on the first display panel 100 may increase, an adhesive force between them may increase, and an adhesion force may be reinforced.

Further, during the process for forming the first recess portion R1, residues such as an organic material on the first lateral side S1 of the display panel 10 may be removed, thus the conductive pad 400 is more strongly attached to the first lateral side of the display panel 10. Accordingly, an open circuit of the wiring layer 180 generated due to exposure of the wiring layer 180 on the first lateral side may be prevented when the flexible circuit board 500 are attached to the first lateral side of the display panel 10.

As described, as the recess portion R1 is provided on the first lateral side of the display panel 10, the contact area between the wiring layer 180 of the display panel 10 and the conductive pad 400 attached to the first lateral side of the display panel 10 increases. Hence, the adhesion force of the conductive pad 400 increases and it may be strongly attached to the first lateral side of the display panel 10, thus the open circuit of the wiring layer 180 exposed on the first lateral side of the display panel 10 may be prevented and defects of the display device 1000 may resultantly be prevented.

For example, when the first width w1 is about 77 μm and the first thickness t1 is about 9 μm, an exposed area of the second wire is about 693 μm² (77 μm×9 μm) when no recess portion R1 is formed in the first lateral side S1. That is, the contact area between the conductive pad 400 and the second wire may be about 693 μm².

For example, when the first depth d1 that is the depth of the first recess portion R1 is about 3 μm and the first thickness t1 is about 9 μm, areas of the first portion R1-1 and the third portion R1-3 are respectively about 27 μm² (3 μm×9 μm). That is, the contact area between the conductive pad 400 and the first portion R1-1 and the contact area between the conductive pad 400 and the third portion R1-3 may respectively be about 27 μm². In other words, the contact area between the conductive pad 400 and the wiring layer 180 is increased by the exposed area of the first portion R1-1 and the third portion R1-3. Thus, a total contact area may be about 747 µm² (693 µm²+27×2 µm²) when the recess portion R1 is formed in the first lateral side S1.

As described above, regarding the display device 1000 according to an exemplary embodiment, when a recess portion R1 is formed in the first lateral side S1 of the display panel 10, the contact area may increase from about 693 µm² to about 747 µm² as compared to the case in which no recess portion is formed in the first lateral side S1. That is, the contact area between the conductive pad 400 and the wiring layer 180 may increase by about 7.7% by forming the recess portion R1 in the first lateral side of the display panel 10. The increase in the contact area may be controlled by altering the depth d1 of the recess portion R1 as required.

A display device 1000 according to an exemplary embodiment will now be described with reference to FIG. 5, FIG. 6, FIG. 7, and FIG. 8. FIG. 5, FIG. 6, FIG. 7, and FIG. 8 show cross-sectional views of a display device 1000 with respect to a line V-V' of FIG. 1 according to another exemplary embodiment. Hereinafter, descriptions that are equivalent or similar to the descriptions provided in the above exemplary embodiment will be omitted or simplified, and different features will be mainly described.

Referring to FIG. 5, the display device 1000 includes a display panel 10, and a flexible circuit board 500 attached to a first lateral side of the display panel 10 and a driving circuit substrate 600 connected to the flexible circuit board 500.

The display panel 10 includes a first display panel 100 and a second display panel 200 bonded to each other to face each other, and a light control layer disposed between the first display panel 100 and a second display panel 200, for example, a liquid crystal layer 300 or a light emitting layer 300. A case in which a liquid crystal layer 300 is disposed between two display panels 100 and 200 will now be exemplarily described with reference to FIG. 1, however, the display device 1000 according to an exemplary embodiment is not limited thereto.

The first display panel 100 may include a first substrate 110, a first wiring layer 120, a gate insulating layer 123, a semiconductor layer 130, and a second wiring layer 170.

The first wiring layer 120 is provided on the first substrate 110, and the first wiring layer 120 may include a same material as and be formed at the same time with a gate electrode 124 of the transistor (TR) and a portion that contacts the conductive pad 400. The gate insulating layer 123 is provided on the first wiring layer 120 except the portion of the first wiring layer 120 that contacts the conductive pad 400. The semiconductor layer 130 is provided on the gate insulating layer 123 corresponding to the gate electrode 124 to overlap the gate electrode 124.

The second wiring layer 170 is provided on the semiconductor layer 130. The second wiring layer 170 may include the same material as and be formed at the same time with a data line 171, a first electrode 173, and a second electrode 175. The first electrode 173 and the second electrode 175 are disposed on portions corresponding to respective ends of the semiconductor layer 130. When one of the first electrode 173 and the second electrode 175 is a source electrode, the other may be a drain electrode. The data line 171 may correspond to the data line (DL) described with reference to FIG. 1, and it transmits the data signal to the pixel.

The first wiring layer 120 and the second wiring layer 170 may include a conductive metal such as Ti or Cu. The first wiring layer 120 and the second wiring layer 170 may be configured as a single layer or a multilayer having at least two layers. For example, the first wiring layer 120 may include a first layer (not shown) made of Ti and a second layer (not shown) made of Cu, and the first layer (not shown) and the second layer (not shown) of the first wiring layer 120 may be about 200 Å and about 6000 Å thick, respectively. For example, the second wiring layer 170 may include a first layer (not shown) made of Ti and a second layer (not shown) made of Cu, and the first layer (not shown) and the second layer (not shown) of the second wiring layer 170 may be about 200 Å and about 3000 Å thick, respectively.

The wiring layer 180 may include a first wiring layer 120 and a second wiring layer 170. Here, a thickness of the wiring layer 180 is defined to be a thickness of a portion in which the wiring layer 180 contacts the conductive pad 400, which is referred to as a first thickness (t1'). The portion that forms the first thickness (t1') may be a portion of the first wiring layer 120 and a portion of the second wiring layer 170. In this instance, the portion of the first wiring layer 120 that contacts the conductive pad 400 may be a dummy gate line which is not connected with the gate electrode 124 which supplies the gate signal, while the portion of the second wiring layer 170 that contacts the conductive pad 400 may be connected with the data line 171. In the exemplary embodiment, the portion of the second wiring layer 170 that contacts the conductive pad 400 may be a dummy data line which is not connected with the data line 171 which supplies the data signal, while the portion of the first wiring layer 120 that contacts the conductive pad 400 may be connected with the gate electrode 124.

In the exemplary embodiment, the portion that forms the first thickness (t1') may be one of a portion of the first wiring layer 120 and a portion of the second wiring layer 170.

The gate electrode 124, the semiconductor layer 130, the first electrode 173, and the second electrode 175 may configure a transistor (TR). FIG. 5 shows a transistor (TR) with a bottom gate structure, however, the transistor (TR) may be a top gate structure in which the gate electrode 124 is provided on the semiconductor layer 130.

A passivation layer (not shown) and a pixel electrode (not shown) may be provided on the transistor (TR). The pixel electrode (not shown) may include an indium tin oxide (ITO), an indium zinc oxide (IZO), and an indium tin zinc oxide (ITZO) that are transparent electrode materials with excellent transmittance, conductivity, and thermal stability.

A first recess portion R1 is formed in the first lateral side S1 of the display panel 10.

The first recess portion R1 is recessed in a direction toward a center of the display panel 10 from the first lateral side S1, that is, a second direction DR2, by a first depth d1. A portion that is recessed from the first lateral side S1 by a first depth d1 is a second portion R1-2 of the first recess portion R1.

In the present exemplary embodiment, a height of the first recess portion R1 along the third direction DR3, that is, a height of the second portion R1-2, is greater than the first thickness (t1') that is the thickness of the wiring layer 180. Therefore, the conductive pad 400 provided to fill the first recess portion R1 may contact part of the first display panel 100 and the second display panel 200 in addition to the wiring layer 180 in the first recess portion R1. By forming the first recess portion R1 greater than the thickness of the wiring layer 180, the adhesion force between the conductive pad 400 and the first lateral side of the display panel 10 may increase.

On the first lateral side S1 of the display panel 10, a pad on a flexible circuit board 500 may be connected to the first recess portion R1. The flexible circuit board 500 is connected to the first recess portion R1 through a conductive pad 400 and a conductive adhesive film 440 disposed between the conductive pad 400 and the flexible circuit board 500.

The flexible circuit board 500 may be a flexible printed circuit board (FPCB). In detail, the flexible circuit board 500 may be configured in a chip on film (COF) form. Accordingly, the data driver (DD) may be connected to the first display panel 100, the second display panel 200, and the driving circuit substrate 600 according to a tape carrier package (TCP) scheme. The flexible circuit board 500 may be bent to the bottom side of the first display panel 100 so the driving circuit substrate 600 may be disposed on the bottom side of the first substrate 100.

The conductive pad 400 may be a metal-mixed solution. For example, it may include Ag, a hardener, and a resin component. The hardener hardens the metal-mixed solution when the metal-mixed solution is heat treated. The resin is a plastic material, and it may support the solid metal to be liquefied.

Recently, to reduce the peripheral area (NDA) that is a non-display area of the display device, a side bonding method for bonding a circuit board or wires on the lateral side of the display panel has been paid attention. To implement the side bonding method, the first lateral side of the display panel including wires may be ground by using a grinding machine. In the grinding process, an organic residue including carbon C may be precipitated on the first lateral side of the grounded display panel. Thus, the wiring layers 180 may be open circuited due to the precipitated organic residue which can be the carbon C precipitated on the first lateral side of the grounded display panel.

In an exemplary embodiment of the present inventive concept, the open circuit of wiring layers due to the organic residue generated when the first lateral side of the display panel 10 is ground may be prevented by forming the recess portion R1 on the first lateral side of the display panel 10, and the contact resistance between the conductive pad 400 and the wiring layer 180 may be reduced by increasing the contact area therebetween.

In detail, part of the conductive pad 400 is provided to fill the first recess portion R1. As the conductive pad 400 fills the first recess portion R1, it contacts the second portion R1-2 and also contacts the first portion R1-1 and the third portion R1-3 provided near the respective sides of the second portion R1-2, although this is not shown in FIG. 5. That is, as the display panel 10 includes the recess portion R1, the area in which the conductive pad 400 contacts the wiring layer 180 such as the first wiring layer 120 and the second wiring layer 170 increases. For example, the contact area of the conductive pad 400 and the wiring layer 180 may increase by the recess portion R1 by an amount of first depth d1×first' thickness (t1')×2. Accordingly, when the flexible circuit board 500 or the driving circuit substrate 600 is electrically connected to the wiring layer 180 through the conductive pad 400, the contact resistance between the conductive pad 400 and the wiring layer 180 reduces and efficiency of the display device 1000 may be resultantly improved.

The second display panel 200 may include a second substrate 210, and a common electrode (not shown), a color filter (CF), and a light blocking member (BM) provided thereon.

A common electrode (not shown) may be provided on the second substrate 210. The common electrode (not shown) may include an indium tin oxide (ITO), an indium zinc oxide (IZO), and an indium tin zinc oxide (ITZO) that are transparent electrode materials with excellent transmittance, conductivity, and thermal stability. The common electrode in the recess portion R1 may be removed to prevent a short circuit between the conductive pad 400 and the common electrode.

A color filter (CF) and a light blocking member (BM) may be formed on the common electrode (not shown). The light blocking member (BM) is disposed between adjacent color filters (CF) to distinguish respective pixel regions (PX, refer to FIG. 1), prevent a light leakage of the display device, and improve contrast. Further, the light blocking member (BM) clearly partitions respective regions of the color filter (CF), so it may block light input to one region from being input to another region. Accordingly, it may function to prevent mixture of different colors displayed by the display device.

A liquid crystal layer 300 including liquid crystal molecules may be provided between the first display panel 100 and the second display panel 200, and a sealant SL, a dummy pattern (DP), and a column spacer (CS) may be further included. The layer provided between the first display panel 100 and the second display panel 200 may not be the liquid crystal layer 300, but may be various kinds of organic light emitting elements.

When the transistor (TR) is turned on according to the gate signal applied to the gate electrode 124, the data signal is applied to a pixel electrode (not shown) through the transistor (TR), and an electric field is generated between the pixel electrode (not shown) and the common electrode (not shown). The liquid crystal molecules of the liquid crystal layer 300 are then rearranged according to the electric field, and the respective pixels PX may express grays corresponding to the data signal.

The sealant SL may prevent leakage of the liquid crystal layer 300 provided between the first display panel 100 and the second display panel 200, and it may be provided to surround edges of the display panels 100 and 200 so as to bond the display panels 100 and 200.

The dummy pattern (DP) and the column spacer (CS) may be provided near the conductive pad 400 outside of the sealant SL. The dummy pattern (DP) may also be provided on the transistor (TR) to protect the transistor (TR) from foreign particles such as moisture or dust particles. The dummy pattern (DP) may include an organic insulating material or an inorganic insulating material.

The dummy pattern (DP) may be provided on the first substrate 110, and may contact the second wiring layer 170 of the transistor (TR). The dummy pattern (DP) may be provided on a first lateral side or may be provided on four lateral sides to surround the edge of the display panels 100 and 200 between the display panels 100 and 200 of the display panel 10. In another way, the dummy pattern (DP) may be provided in an island shape so as to correspond to the region in which the conductive pad 400 is provided.

A column spacer (CS) is disposed on the dummy pattern (DP). According to an exemplary embodiment, one of the column spacer (CS) and the dummy pattern (DP) may be omitted. In another way, the sealant SL may have an increased width to be disposed adjacent the conductive pad 400 instead of the dummy pattern (DP) and the column spacer (CS).

Figure 6:
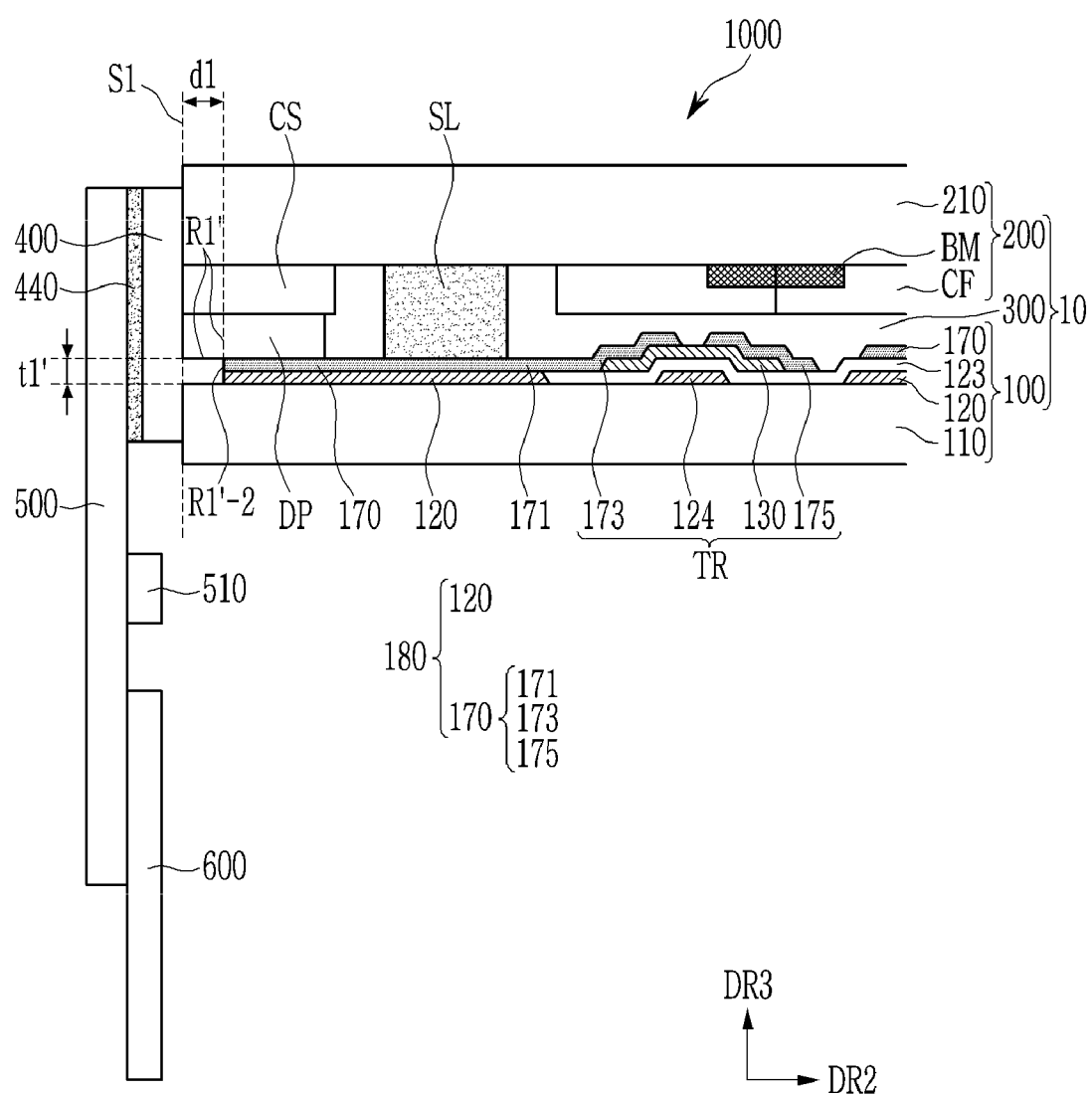

Referring to FIG. 6, the first recess portion R1 is formed in the region corresponding to the first' thickness (t1'). That is, the height of the first recess portion R1 is equivalent to the first' thickness (t1'). In the case of the present exemplary embodiment, the recess portion R is formed on the portion where the conductive pad 400 contacts the wiring layer 180, thereby simplifying the process by reducing the process time, energy, and expense when the recess portion R is formed. In an exemplary embodiment described with reference to FIG. 4, a degree that the contact area between the conductive pad 400 and the wiring layer 180 increases is equivalent to first depth d1× first' thickness (t1')×2, which may be substantially the same.

Figure 7:
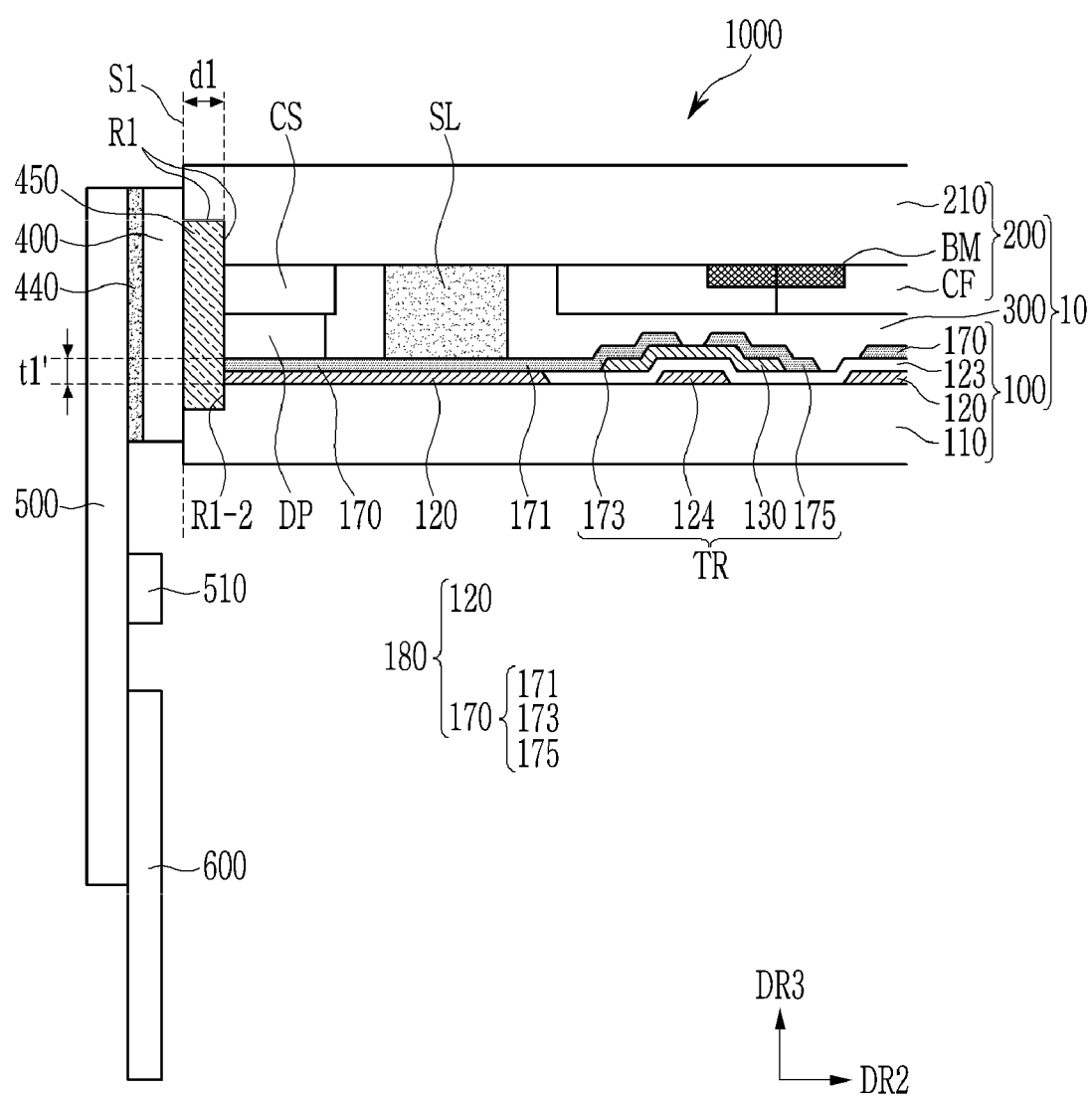

Referring to FIG. 5 and FIG. 7, the first recess portion R1 is provided so that not the conductive pad 400 but a conductive filler 450 may fill the same. The conductive pad 400 is provided on the conductive filler 450.

The conductive filler 450 includes a material that is different from the metal included in the conductive pad 400. For example, when the conductive pad 400 is Ag, the conductive filler 450 may be a metal that is less expensive than Ag and that is different from Ag and that has electrical conductivity. For example, the conductive filler 450 may be a metal such as Cu. As described, the short circuit of the wiring layer 180 disposed adjacent to each other may be more efficiently prevented by filling the first recess portion R1 with a different material from the conductive pad 400.

Figure 8:
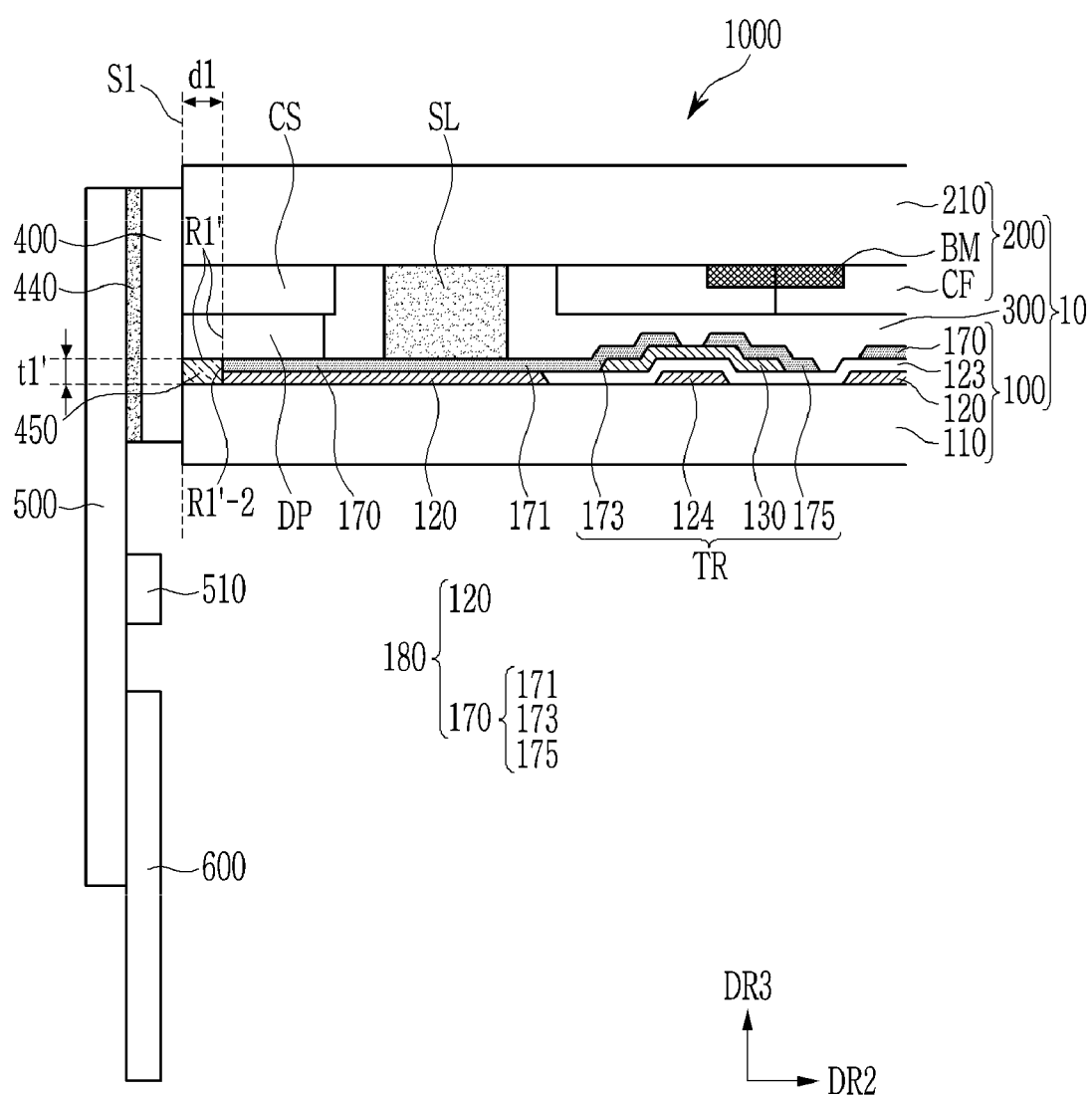

Referring to FIG. 6 and FIG. 8, as described above, the first recess portion R1 is provided so that it may be filled not by the conductive pad 400 but by the conductive filler 450. The short circuit of the wiring layer 180 may be further efficiently prevented by filling the first recess portion R1 with a different material of the conductive filler 450.

Figure 9:
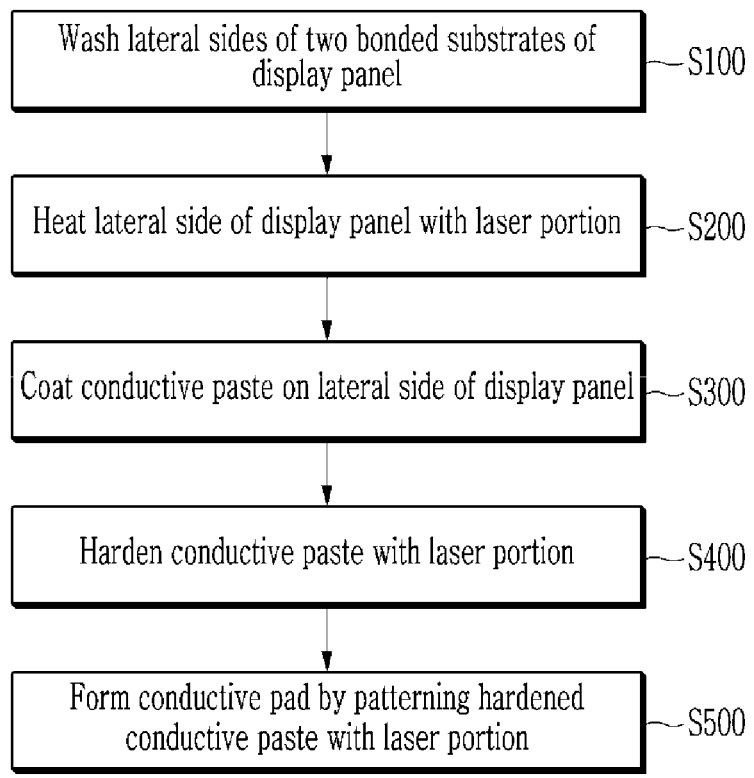
FIG. 9 shows a block diagram of a method for manufacturing a display device according to an exemplary embodiment.

A method for manufacturing a display device 1000 according to an exemplary embodiment will now be described with reference to FIG. 9, FIG. 10, FIG. 11, FIG. 12, and FIG. 13. FIG. 9 shows a block diagram of a method for manufacturing a display device 1000 according to an exemplary embodiment, and FIG. 10, FIG. 11, FIG. 12, and FIG. 13 show perspective views of a display device 1000 according to an exemplary embodiment showing respective stages shown in FIG. 9.

Figure 10:
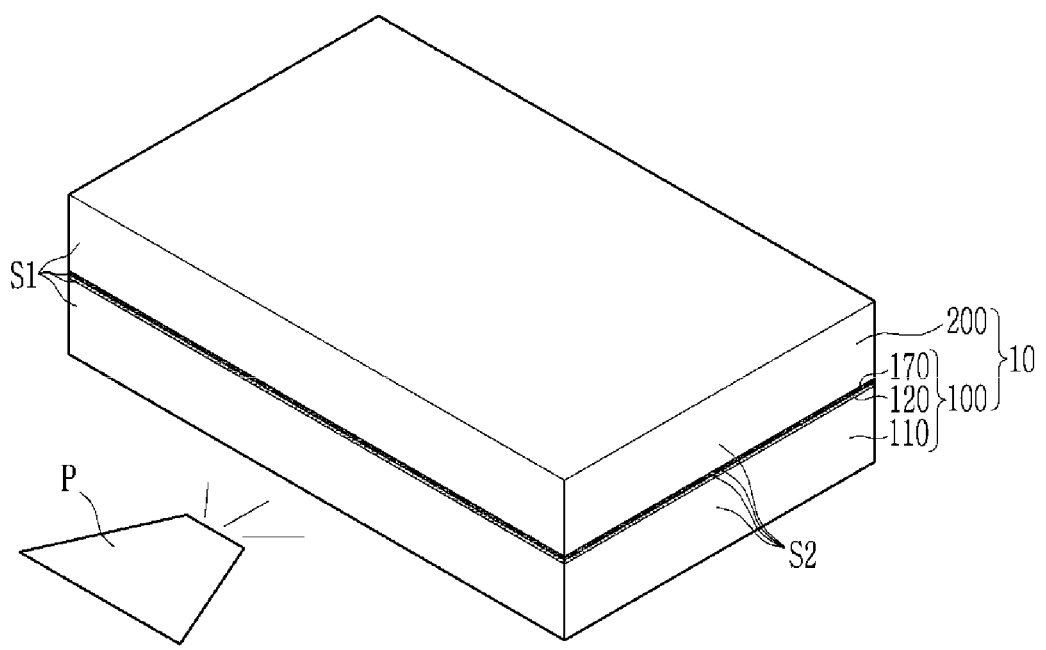
FIG. 10, FIG. 11, FIG. 12, and FIG. 13 show perspective views of a display device according to an exemplary embodiment showing respective stages shown in FIG. 9.

Referring to FIG. 9 and FIG. 10, the first lateral side of the display panel 10 in which the first display panel 100 and the second display panel 200 are bonded may be washed by an atmospheric pressure plasma using a plasma washing device (P) (S100). The first display panel 100 includes a first wiring layer 120 and a second wiring layer 170. The first lateral side includes at least one of a first lateral side S1 and a second lateral side S2. Contaminated materials such as an organic material or a Cu oxide remaining on the first lateral side may be firstly removed by plasma washing. Through this, adherence between the conductive paste (CP) forming the conductive pad 400 and the first lateral side of the display panel 10 may be improved.

Figure 11:
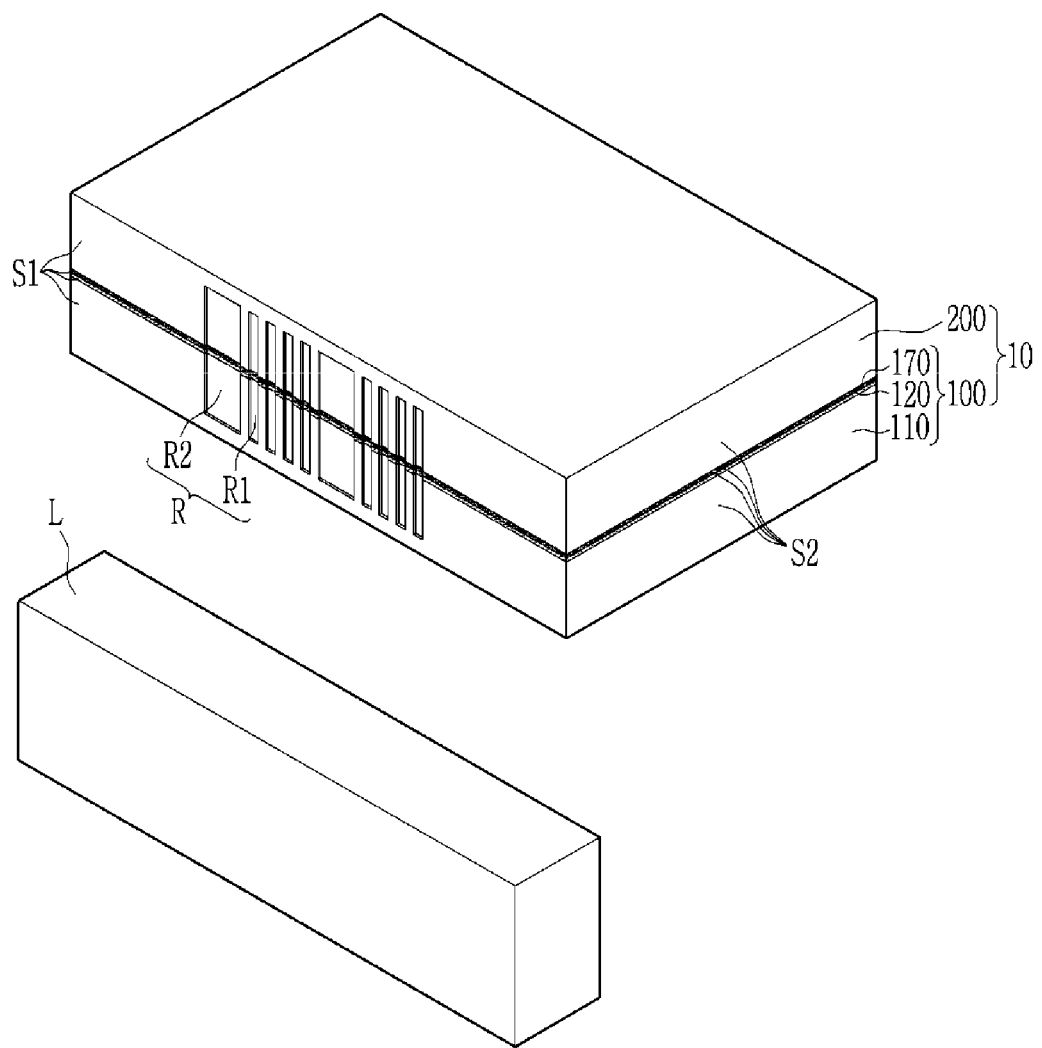

Referring to FIG. 11, a side-bonded portion of the first lateral side of the display panel 10 to which plasma washing is performed is heated with a laser L (S200). In this instance, the laser L may generate pulse-type first laser beams with 1 W energy. The first lateral side of the display panel 10 may be heated by applying the pulse-type first laser beams. The heating may be repeated eight times. When the pulse-type first laser beams are applied as described above, the residue of the organic material on the lateral side of the display panel 10 is firstly removed. As the number of applications of the pulse-type laser beams increases, a recess portion R is formed on the first lateral side of the display panel 10. In this instance, various shapes of recess portions (R) may be formed by controlling a source of the laser L.

The recess portion R includes a first recess portion R1 and a second recess portion R2. At least one of the first recess portion R1 and at least one of the second recess portion R2 may be formed. A horizontal width of the first recess portion R1 may be less than a horizontal width of the second recess portion R2.

Figure 12:
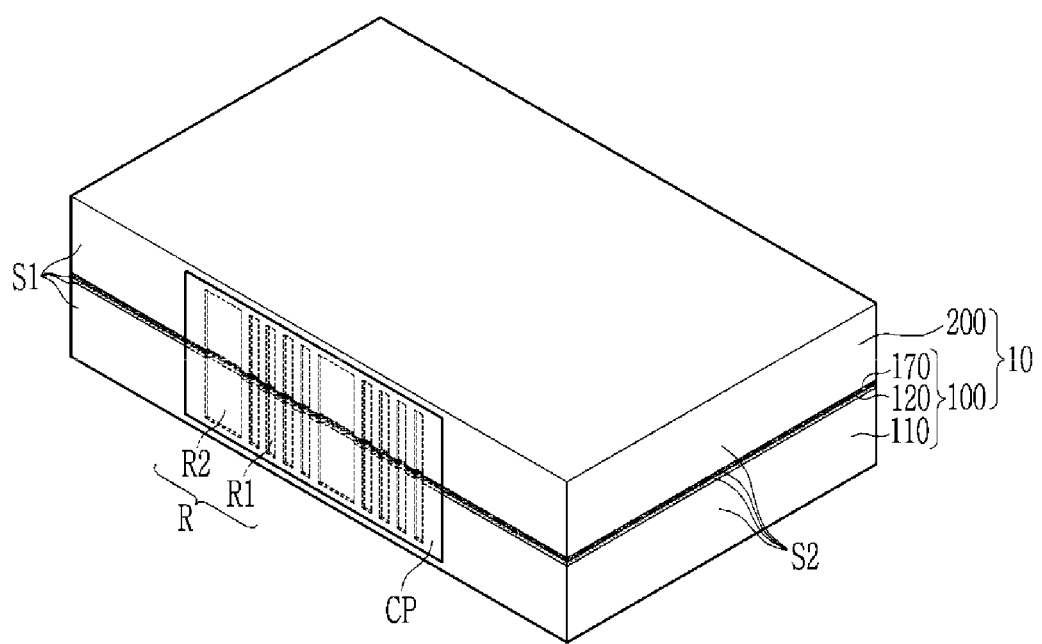

Referring to FIG. 12, a conductive paste (CP) is coated on the first lateral side of the display panel 10 in which the recess portion R is formed (S300). The conductive paste (CP) is printed in a predetermined region on the first lateral side S1 of the display panel 10 by a stamp method using a printing scheme, and may be integrally formed. In another way, the conductive paste (CP) may be integrally formed in the predetermined region by spraying the conductive paste (CP).

According to exemplary embodiments, the coated region of the conductive paste (CP) may be a part of the first lateral side of the display panel 10. However, it may be formed on a plurality of lateral sides.

The conductive paste (CP) may include a metal with electrical conductivity. Depending on exemplary embodiments, the metal may be Ag, Cu, Au, or Al, and for example, it may be Ag. The conductive paste (CP) is not limited thereto.

Although not shown, the conductive paste (CP) coated on the first lateral side of the display panel 10 is heated with a laser (S400). As described, the conductive paste (CP) may be an Ag mixed solution including Ag, a hardener, and a resin, so when the conductive paste (CP) is heated with a laser, the hardener in the conductive paste (CP) may be hardened and the conductive paste (CP) may be fixed to the first lateral side of the display panel 10. The applied second laser beams in this instance may be, differing from step S200, not the pulse type of beams but continuous type of beams. The hardening laser beams may focus heat on required portions of the first lateral side of the display panel 10 to thus prevent a portion other than the predetermined region from being heated, and prevent other portions from being damaged.

Through the hardening step of S400, a volatile material in the conductive paste (CP) is vaporized and a conductive material may remain. Further, the conductive paste (CP) may be firmly fixed on the first lateral side of the display panel 10, and surface rigidity may be improved.

Figure 13:
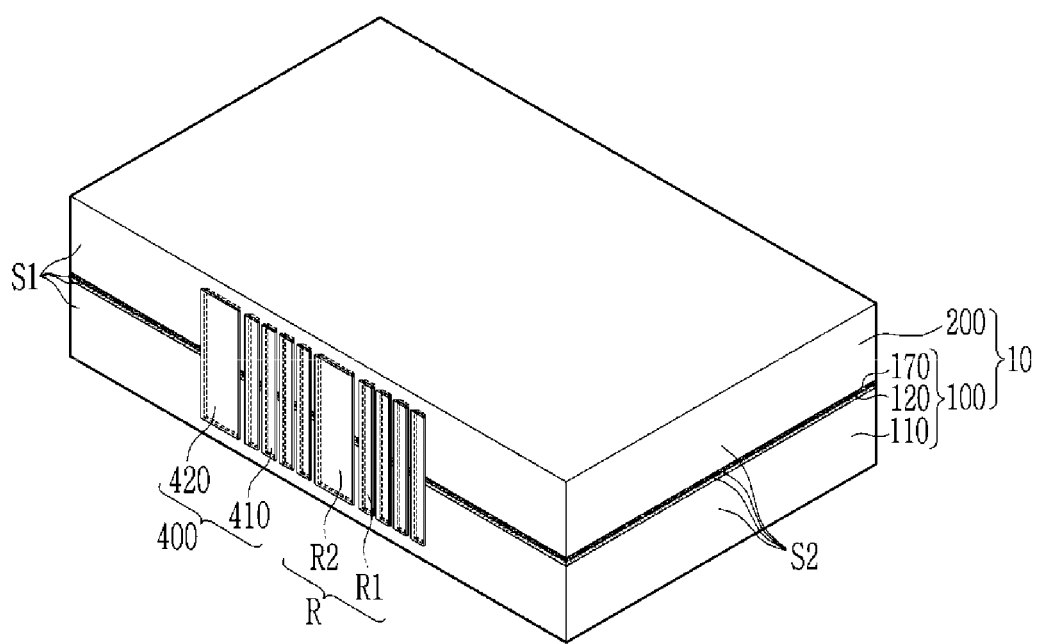

Referring to FIG. 13, a conductive pad 400 is formed by patterning the hardened conductive paste (CP) with a laser (S500).

The patterning laser beams may be a pulse-type as described in S200. However, differing from step S200, beams may be applied with energy greater than the energy applied in S200, for example, with 3 W energy. In a like manner as the recess portion R forming process (S200), various shapes of the conductive pad 400 may be etched by controlling the source of the laser beam.

As described, the conductive pad 400 may be formed on the first lateral side of the display panel 10 by the laser patterning, corresponding to the shape of the recess portion R. The conductive pad 400 may include a first pad 410 and a second pad 420. The first pad 410 may be formed on a portion corresponding to the first recess portion R1 and the second pad 420 may be formed on a portion corresponding to the second recess portion R2.

In this instance, by forming the recess portions R, the contact area between the conductive pad 400 and the wiring layer 180 increases, the open circuit of the wiring layer 180 exposed in the recess portion R may be prevented and the contact resistance between the conductive pad 400 and the wiring layer 180 may be reduced.

Referring to FIG. 1, circuit elements such as the flexible circuit board 500 and the driving circuit substrate 600 are attached to the conductive pad 400, so the electrical signal supplied through them may be transmitted to the display panel 10 through the conductive pad 400.

While this inventive concept has been described in connection with what is presently considered to be practical exemplary embodiments, it is to be understood that the inventive concept is not limited to the disclosed embodiments. On the contrary, it is intended to cover various modifications and equivalent arrangements included within the spirit and scope of the appended claims.

What is claimed is:

1. A display device comprising:
a display panel including a first substrate on which a thin film transistor is disposed, a second substrate facing the first substrate and a wiring layer disposed on the first substrate between the first substrate and the second substrate; and
a flexible circuit board disposed on a first lateral side of the display panel,
wherein the display panel includes a recess portion recessed from the first lateral side,
the wiring layer is exposed in the recess portion,
the flexible circuit board includes a conductive pad, and
the conductive pad contacts the wiring layer in the recess portion to electrically connect the flexible circuit board and the wiring layer,
wherein the recess portion includes a first recess recessed from the first lateral side into the first substrate, and
wherein the recess portion includes a plurality of recess portions and at least two recess portions among the plurality of recess portions have different widths.

2. The display device of claim 1, wherein
the recess portion further includes a second recess portion recessed from the first lateral side into the second substrate and a third recess portion recessed from the first lateral side into the wiring layer.

3. The display device of claim 2, wherein
the first recess portion, the second recess portion and the third recess portion are recessed from the first lateral side by a first depth, and
the first depth is 0.5 μm to 10 μm.

4. The display device of claim 2, further comprising a conductive filler disposed between the conductive pad and the wiring layer to fill the recess portion.

5. The display device of claim 2, wherein
the wiring layer includes a first wiring layer and a second wiring layer electrically connected to each other,
the first wiring layer includes a same material as and is formed at the same time with a gate electrode of the thin film transistor, and
the second wiring layer includes a same material as and is formed at the same time with a data line of the thin film transistor.

6. The display device of claim 2, wherein
a height of the recess portion is greater than a thickness of the wiring layer, and
the conductive pad completely fills the recess portion.

7. The display device of claim 1, further comprising a dummy pattern disposed on the wiring layer to overlap the wiring layer, the dummy pattern directly contacting the conductive pad, and a column spacer disposed on the dummy pattern to overlap the dummy pattern, the column spacer directly contacting the conductive pad.

8. A display device comprising:
a display panel including a first substrate on which a thin film transistor is disposed, a second substrate facing the first substrate and a wiring layer disposed on the first substrate between the first substrate and the second substrate; and
a flexible circuit board disposed on a first lateral side of the display panel,
wherein the display panel includes a recess portion recessed from the first lateral side,
the wiring layer is exposed in the recess portion on the first lateral side,
the flexible circuit board includes a conductive pad, and
the conductive pad contacts the wiring layer in the recess portion to electrically connect the flexible circuit board and the wiring layer, and
wherein the recess portion is recessed from the first lateral side into the wiring layer and a height of the recess portion is equivalent to a thickness of the wiring layer.

9. The display device of claim 8, further comprising a dummy pattern disposed on the wiring layer to overlap the wiring layer, the dummy pattern directly contacting the conductive pad, and a column spacer disposed on the dummy pattern to overlap the dummy pattern, the column spacer directly contacting the conductive pad.

10. The display device of claim 8, wherein
the recess portion are recessed from the first lateral side by a first depth, and
the first depth is 0.5 μm to 10 μm.

11. The display device of claim 8, further comprising a conductive filler disposed between the conductive pad and the wiring layer to fill the recess portion.

12. The display device of claim 8, wherein the recess portion includes a plurality of recess portions, at least two recess portions among the plurality of recess portions having different widths.

13. The display device of claim 8, wherein
the wiring layer includes a first wiring layer and a second wiring layer electrically connected to each other,
the first wiring layer includes a same material as and is formed at the same time with a gate electrode of the thin film transistor, and
the second wiring layer includes a same material as and is formed at the same time with a data line of the thin film transistor.

14. The display device of claim 8, wherein the conductive pad completely fills the recess portion.

* * * * *